(12) United States Patent
Buerkle et al.

(10) Patent No.: US 11,031,070 B1
(45) Date of Patent: Jun. 8, 2021

(54) APPARATUS AND METHOD FOR PERFORMING CONTINUOUS TIME LINEAR EQUALIZATION ON A COMMAND/ADDRESS SIGNAL

(71) Applicant: Micron Technology, Inc., Boise, ID (US)

(72) Inventors: Todd M. Buerkle, Boise, ID (US); Eric J. Stave, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/773,672

(22) Filed: Jan. 27, 2020

(51) Int. Cl.
*G11C 7/10* (2006.01)
*G11C 11/4093* (2006.01)
*G11C 11/4076* (2006.01)
*G11C 11/408* (2006.01)
*G06F 9/54* (2006.01)
*G06F 9/30* (2018.01)
*H04L 25/03* (2006.01)

(52) U.S. Cl.
CPC ...... *G11C 11/4093* (2013.01); *G06F 9/30189* (2013.01); *G06F 9/544* (2013.01); *G06F 9/546* (2013.01); *G11C 11/408* (2013.01); *G11C 11/4076* (2013.01); *H04L 25/03878* (2013.01)

(58) Field of Classification Search
CPC ............ G11C 11/4093; G11C 11/4076; G11C 11/408; G06F 9/30189; G06F 9/544; G06F 9/546; H04L 25/03878
USPC ..................................................... 365/189.05
See application file for complete search history.

(56) References Cited

U.S. PATENT DOCUMENTS

| | | | | |
|---|---|---|---|---|
| 5,357,519 A * | 10/1994 | Martin | ............. | G01R 31/31915 702/119 |
| 7,480,378 B2 * | 1/2009 | Everett | ................. | H04M 19/02 379/413.01 |
| 8,319,520 B2 * | 11/2012 | Kim | .................... | H04L 25/0298 326/30 |
| 8,451,021 B1 * | 5/2013 | Fox | ..................... | H04L 25/0278 326/30 |
| 9,589,626 B1 * | 3/2017 | Liu | ....................... | G11C 7/1006 |
| 9,608,632 B1 * | 3/2017 | Lee | ................... | H03K 19/0005 |
| 9,966,908 B1 * | 5/2018 | Carey | ................ | H04L 25/0272 |
| 2005/0225353 A1 * | 10/2005 | Kwon | ................. | H04L 25/0278 326/30 |
| 2008/0284467 A1 * | 11/2008 | Koo | ..................... | G11C 7/1051 326/30 |
| 2009/0016124 A1 * | 1/2009 | Kim | ..................... | G11C 7/1009 365/194 |
| 2009/0091349 A1 * | 4/2009 | Bhakta | ................. | G11C 7/1069 326/30 |

(Continued)

*Primary Examiner* — Viet Q Nguyen
(74) *Attorney, Agent, or Firm* — Perkins Coie LLP

(57) ABSTRACT

A method for equalizing command/address signals in a memory device includes receiving a status of a termination pin for a memory device and automatically performing equalization on signals received on a command/address bus channel of the memory device based on the status. An apparatus for equalizing command/address signals in a memory device includes an input buffer circuit configured to receive the signals from a command/address bus channel. The apparatus also includes a filter circuit configured to automatically perform equalization on the signals based on a status of a termination pin.

20 Claims, 5 Drawing Sheets

500

510
Receive a status of a termination pin for a memory device

520
Automatically perform equalization on signals received on a command/address bus channel of the memory device based on the status

(56) References Cited

U.S. PATENT DOCUMENTS

| | | | |
|---|---|---|---|
| 2012/0146687 A1* | 6/2012 | Kim | H03K 19/0005 |
| | | | 326/30 |
| 2015/0076703 A1* | 3/2015 | Park | H01L 23/5286 |
| | | | 257/773 |
| 2015/0131388 A1* | 5/2015 | Ware | G06F 13/1684 |
| | | | 365/189.02 |
| 2015/0149678 A1* | 5/2015 | Kim | H04L 25/0292 |
| | | | 710/302 |
| 2015/0179248 A1* | 6/2015 | Patil | G06F 1/3275 |
| | | | 365/233.1 |
| 2016/0285483 A1* | 9/2016 | Ke | H04B 1/0475 |
| 2020/0058332 A1* | 2/2020 | Choi | G11C 11/4082 |
| 2020/0092014 A1* | 3/2020 | de Rochemont | H03H 7/06 |
| 2020/0105335 A1* | 4/2020 | Ware | G11C 7/1051 |

* cited by examiner

APPARATUS AND METHOD FOR PERFORMING CONTINUOUS TIME LINEAR EQUALIZATION ON A COMMAND/ADDRESS SIGNAL

TECHNICAL FIELD

The present disclosure generally relates to apparatus and method for performing an equalization on a command/address ("CA") signal, and more particularly, performing continuous time linear equalization ("CTLE") on the CA signal.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), static RAM (SRAM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

Memory devices incorporate numerous high-speed buses for transmitting signals. The channels on the buses can be subjected to large capacitive loads in the channel or dispersion effects where different frequencies are attenuated by different amounts (usually, the higher frequencies are attenuated more than the lower frequencies, causing the channel to behave like a low-pass filter). In prior generation memory devices, the issue of frequency attenuation on the command/address signals was not a big concern because the speed of the command/address bus was relatively slow in comparison to the I/O bus. As memory speeds continue to increase, however, the command/address bus is running at transmission speeds that are similar to I/O bus speeds of the prior generation memory devices. With the increasing speeds in the memory devices, the signals on the command/address bus can also be subject to bandwidth limited channels and other issues that can reduce signal integrity. Accordingly, strategies are now needed to improve the performance of the command/address bus.

DETAILED DESCRIPTION

Embodiments of the present technology are directed to memory devices, systems including memory devices, and methods of performing command/address signal equalization. In one embodiment, a method of equalizing includes receiving a status signal of an on-die-termination pin for a memory device and automatically performing equalization on signals received on a command/address bus channel based on the status signal. In some embodiments, the equalization includes performing a continuous time linear equalization. In some embodiments, the level of equalization can preferably be varied based on the on-die termination setting for the CA bus that is applied to a targeted device. This allows for different CTLE settings to be used based on the mode register settings for internal termination resistor for the CA bus (e.g., a first CTLE setting if an 80 ohm termination is programmed via the mode register and a second CTLE setting if a 40 ohm termination is programmed via the mode register).

Figure 1:
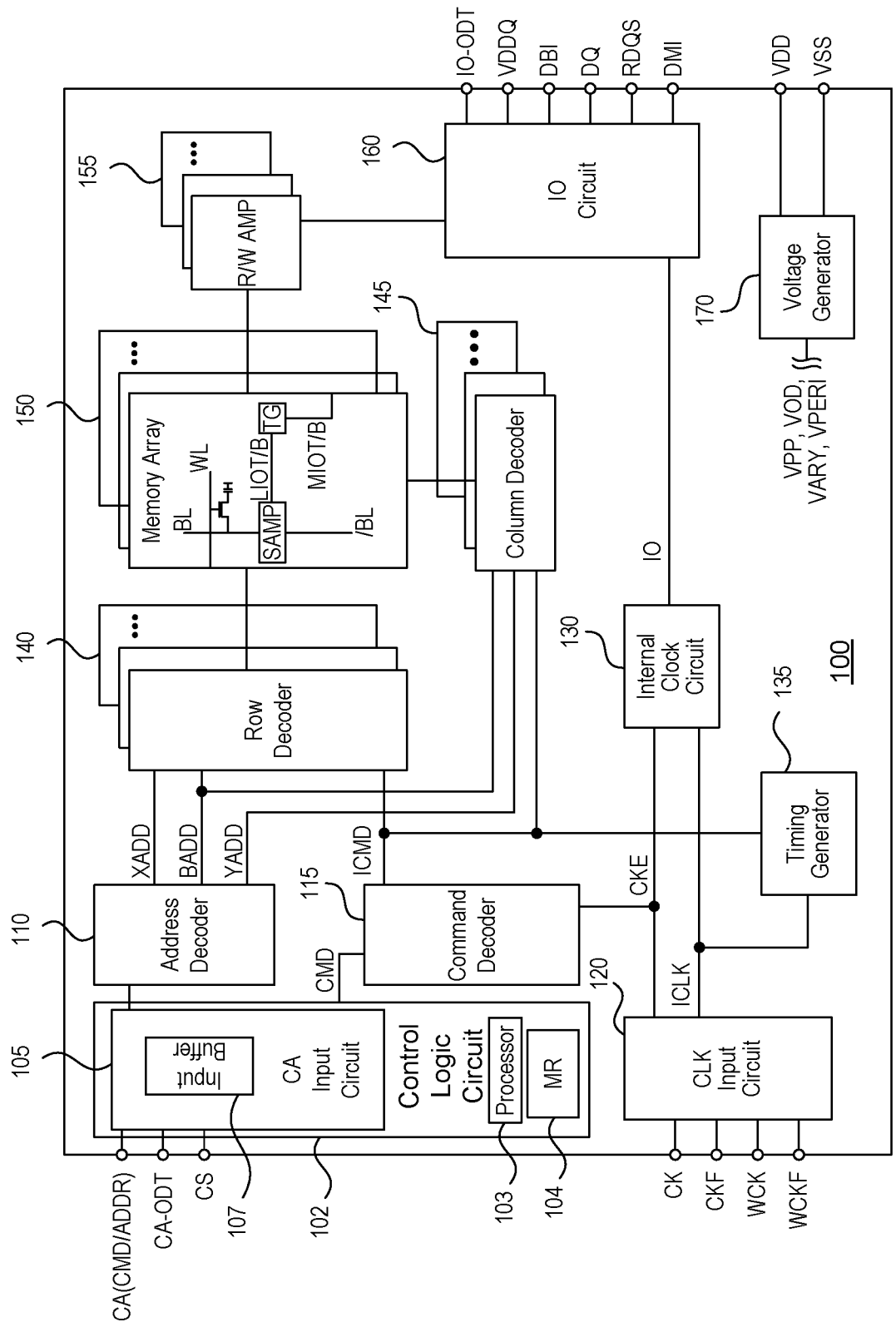
FIG. 1 is a simplified block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command/address terminals to receive CA signals. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and input-output on-die terminal(s) IO-ODT.

The CA signals can include address signals ADDR from an external controller. The address signals ADDR supplied to the CA terminals can be transferred, via a CA input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145. As seen in FIG. 1, in some embodiments, the CA input circuit 105 can be part of control logic circuit 102. Control logic circuit 102 can include processor 103 that can perform all or part of the processing steps of memory device 100. The control logic circuit 102 can also include the mode register 104 that can store the settings used to configure various circuits in the memory device 100.

The CA signals can also include command signals CMD. The CMD signals can represent various memory commands from the memory controller (e.g., including access commands, which can include read commands and write commands). The CS signal can be used to select the memory device 100 to respond to commands and addresses provided to the CA terminals. The CA signals and the CS signal can be transmitted from an external controller. When an active CS signal is provided to the memory device 100, the commands and addresses in the CA signals can be decoded and memory operations can be performed. The CMD signals may be provided to a command decoder 115 via the command/address input circuit 105. The command decoder 115 may include circuits to decode the CMD signals to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information that can be programmed in the memory device 100, for example, in a mode register 104. The read latency information can be defined in terms of clock cycles of the CK clock signal. For example, the read latency information can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency information. The write latency information can be programmed in the memory device 100, for example, in the mode register 104. The write latency information can be defined in terms of clock cycles of the CK clock signal. For example, the write latency information can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The input-output on-die termination terminal(s) may be supplied with an IO-ODT signal. The IO-ODT signals can be supplied to the input/output circuit 160 to instruct the memory device 100 to enter an I/O on-die termination mode (e.g., to provide one of a predetermined number of impedance levels at one or more of the other input-output terminals of the memory device 100).

Memory devices such as memory device 100 are frequently used in applications where data reliability is an important consideration. Accordingly, improving signal integrity on the command/address bus of memory device can provide a number of advantages such as improved data reliability. One approach to improving data reliability is to provide an internal termination resistor on each of the CA bus channels. In some embodiments, for example as seen in FIG. 1, the memory device 100 can include a command/address on-die termination (CA-ODT) pin and the status of the CA-ODT pin can determine whether to enable the internal termination resistor for each of the CA bus channels. For example, tying the CA-ODT pin to voltage source VDD can enable the internal termination resistor. Of course, in some embodiments, the CA-ODT pin can be tied to another voltage source (e.g., VSS) or no voltage source for enabling the internal termination resistor. In some embodiments, the internal termination resistor may be enabled by default and appropriate voltage on the CA-ODT pin is needed to disable the internal termination resistor. While the internal termination resistance can provide some inter-symbol interference and signal integrity improvement, further improvements to the signal integrity can still be made.

Figure 2:
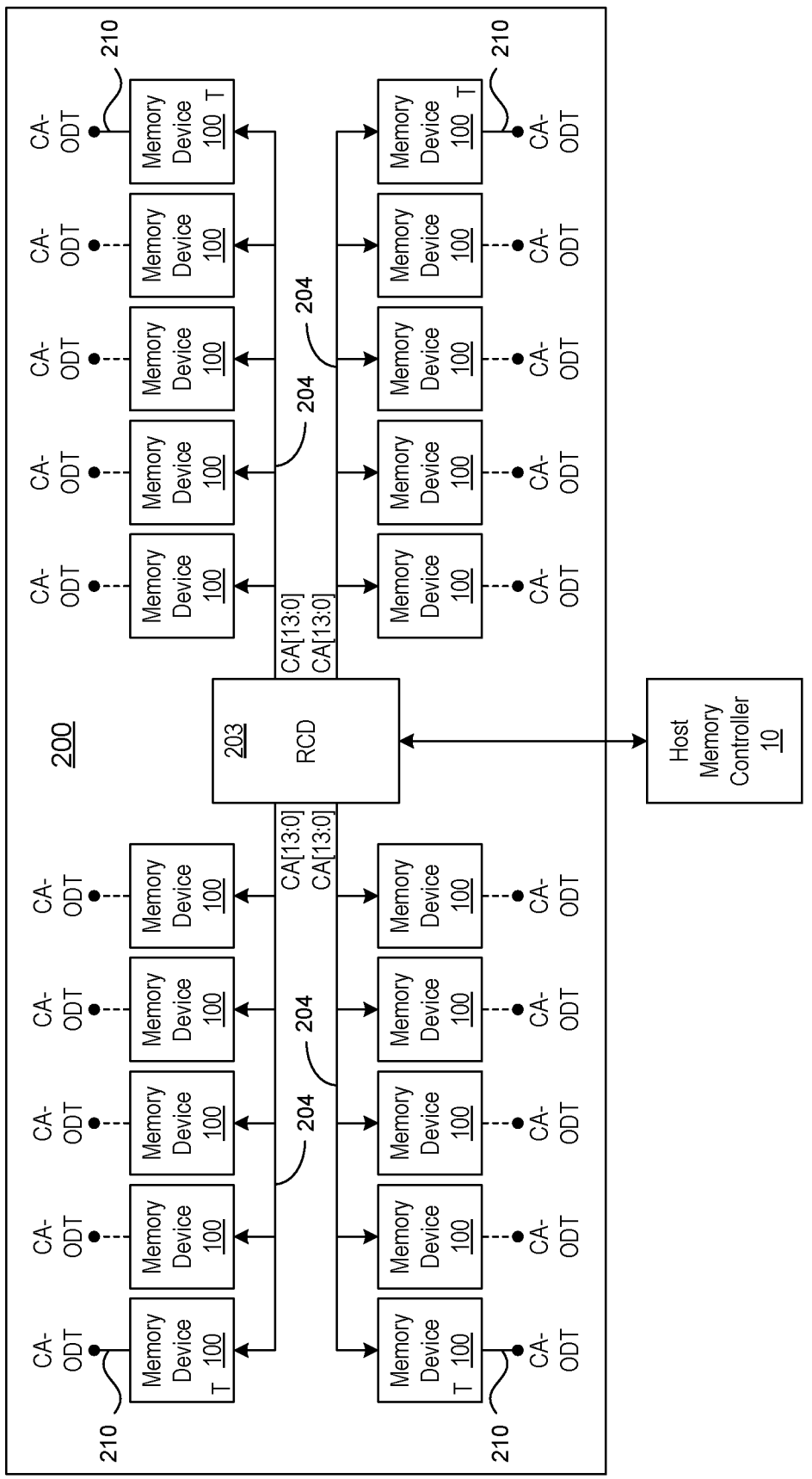
FIG. 2 is a simplified block diagram schematically illustrating a memory module in accordance with an embodiment of the present technology.

A simplified block diagram of a memory module 200 in accordance with an embodiment of the present technology is illustrated in FIG. 2. In some embodiments, the memory module 200 can be a dual in-line memory module (DIMM). As illustrated in FIG. 2, the memory module 200 can include a plurality of memory devices 100, which can be, for example, DRAM memory devices. A host memory controller 10 can provide signals via an edge connector (not shown) to a registering clock driver (RCD) 203. The signals can include, for example, command/address signals. The RCD 203 can re-drive/distribute the CA signals from the host memory controller 10 over one or more command/address buses 204 to each of the plurality of memory devices 100. The memory module 200 can also include a data bus (not illustrated) for transmitting data signals between the host memory controller 10 and the memory devices 100.

One or more memory devices 100 can include on-die termination resistances on the CA bus channels when needed to help reduce signal reflection and improve signal quality on the channel. The on-die termination resistance for the CA bus channel can be switched ON and OFF based on the status of the CA-ODT pin 210 of the memory device 100. For example, as seen in FIG. 2, each memory device 100 includes a CA-ODT pin 210 that can be connected (e.g., hard tied) to a voltage source (e.g., VDD, VSS or some other source based on the configuration of the memory device 100) to enable the on-die termination resistances for the CA bus channels of the memory device 100. In some embodiments, one or more the memory devices 100 that are farthest from the RCD 203 (signal path-wise) in each CA bus 204 can have its CA-ODT pin 210 enabled. For example, the memory devices 100 that are labeled with a "T" in FIG. 2 can have their respective CA-ODT pin (solid line) tied to a voltage source and thus have their internal termination resistors enabled. The CA-ODT pins (dotted lines) on the other memory devices are not tied to a voltage source and thus do not have their internal termination resistors enabled. In some cases, along with the farthest memory devices on each CA bus 204, one or more of the other memory devices 100 can have the CA-ODT pin 210 tied to a voltage source and thus enable the respective internal termination resistor. In some embodiments, the farthest memory devices 100 may not have the internal termination resistor enabled while one or more memory devices 100 in the middle of the CA bus 204 have their internal termination resistors enabled. Determination of which memory devices 100 should have their CA-ODT pin 210 tied to a voltage source can be done during, for example, manufacture testing, and the appropriate CA-ODT pin 210 can be tied to the appropriate voltage source (e.g., by hard wiring and/or via appropriate mode register setting) based on the results. If the CA-ODT pin 210 is tied to a voltage source, along with being enabled, the internal termination resistance in the respective memory device 100 can be programmed with a predetermined value. For example, based on settings in the mode register of the memory device 100, the internal termination resistor at one or more of the CA terminals of the memory device 100 can be set to one of a predetermined number of resistance levels (e.g., 40 ohms, 80 ohms, or some other value).

Figure 3:
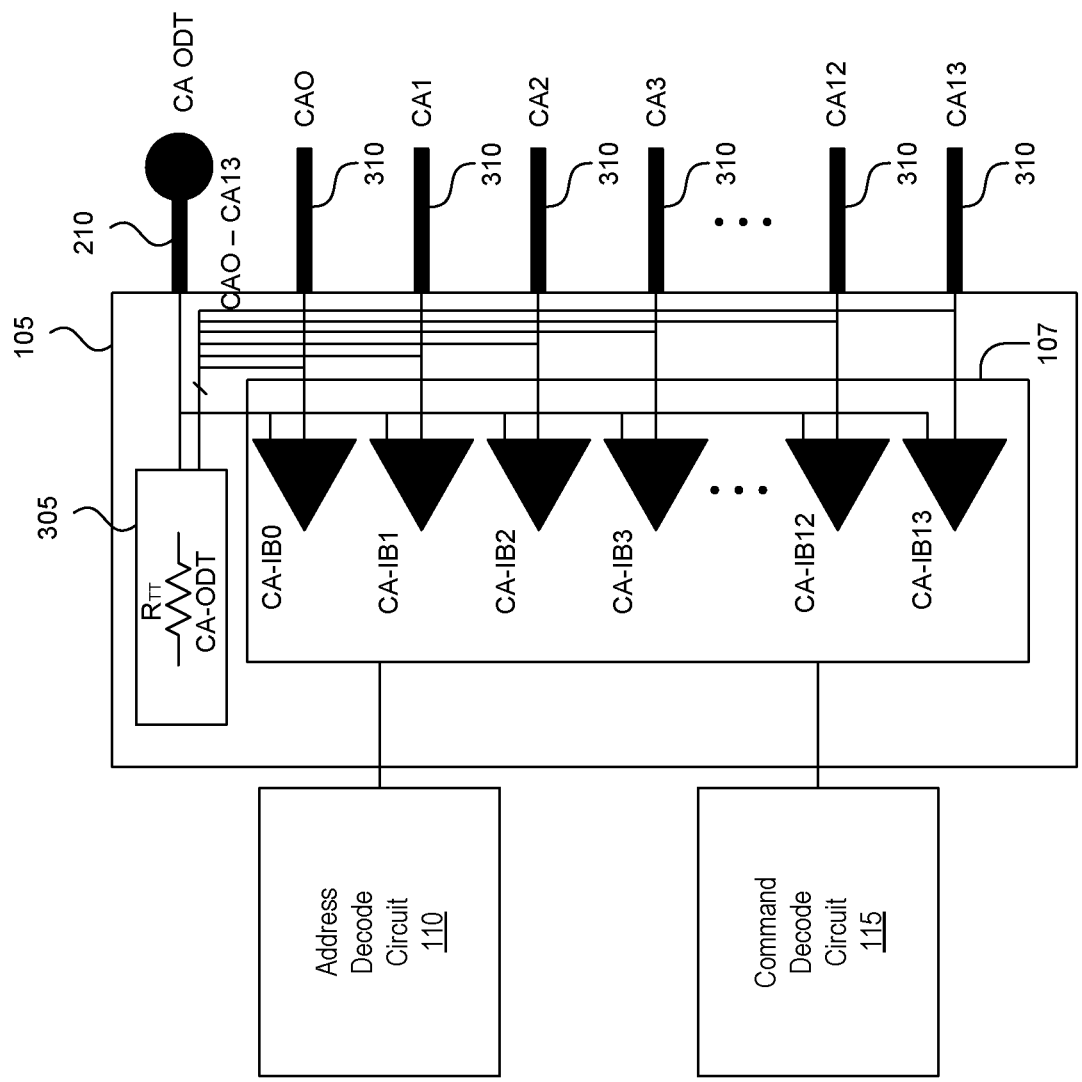
FIG. 3 is a simplified block diagram of an input buffer in accordance with embodiments of the present technology.

FIG. 3 illustrates an exemplary block diagram of a CA input circuit 105 in accordance with an embodiment of the present technology. The CA input circuit 105 can include a plurality of CA inputs 310. For example, the CA input circuit 105 can have fourteen CA inputs 310 to receive CA signals CA0 to CA13 on the respective channels of CA bus 204. Of course, the number of CA inputs can be higher or lower than fourteen depending on the configuration of the memory device 100. The CA input circuit 105 can include the CA ODT pin 210, which is discussed above. The CA-ODT pin 210 can be connected to CA-ODT Circuit 305, which includes an internal termination resistor RTT for each of the CA bus channels. Based on the status of CA ODT pin 210 (e.g., tied to an appropriate voltage source (e.g., VDD) or not), the CA bus channels for CA signals CA0 to CA13 are terminated to the respective internal termination resistor RTT. In some embodiments, based on the setting in the mode register, each resistor RTT can be set to a predetermined value such as, for example, 40 ohms, 80 ohms, or some other appropriate value. In some embodiments, the RTT values in each of the CA-ODT enabled memory devices 100 can be the same. For example, the RTT value for the "T" memory devices 100 in a memory module 200 can have a same value (e.g., 40 ohms, 80 ohms, or some other appropriate value). In some embodiments, one or more CA-ODT enabled memory devices 100 can have an RTT value that is different from the other RTT values. For example, one or more "T" memory devices 100 can have an RTT value that is different than the RTT values of the other "T" memory devices 100. In some embodiments, CA-OTD enabled memory devices 100 in the middle of a CA bus 204 can have a different RTT value than the RTT value of the "T" memory device 100 on the respective CA bus 204. For example, one or more of the middle memory devices 100 can have an RTT value of 40 ohms while the corresponding "T" memory device can have a value of 80 ohms. Programming internal termination resistors for ODT is known in the art and thus, for brevity, will not be discussed in further detail.

As seen in FIG. 3, the CA inputs 310 are received by input buffer 107, which can be part of the CA input circuit 105 and/or another circuit in memory device 100. The input buffer 107 isolates the memory device 100 from the CA bus 204 and the other components of memory module 200. The input buffer 107 includes a plurality of CA input buffers CA-IB0 to CA-IB13 that receive the respective CA input signal CA0 to CA13. The outputs signals from the input buffer 107 are sent to the appropriate address decode circuit 110 or the command decode circuit 115. Operation of the address decode circuit 110 and the command decode circuit 115 is known in the art and thus, for brevity, will not be discussed in further detail.

Figure 4:
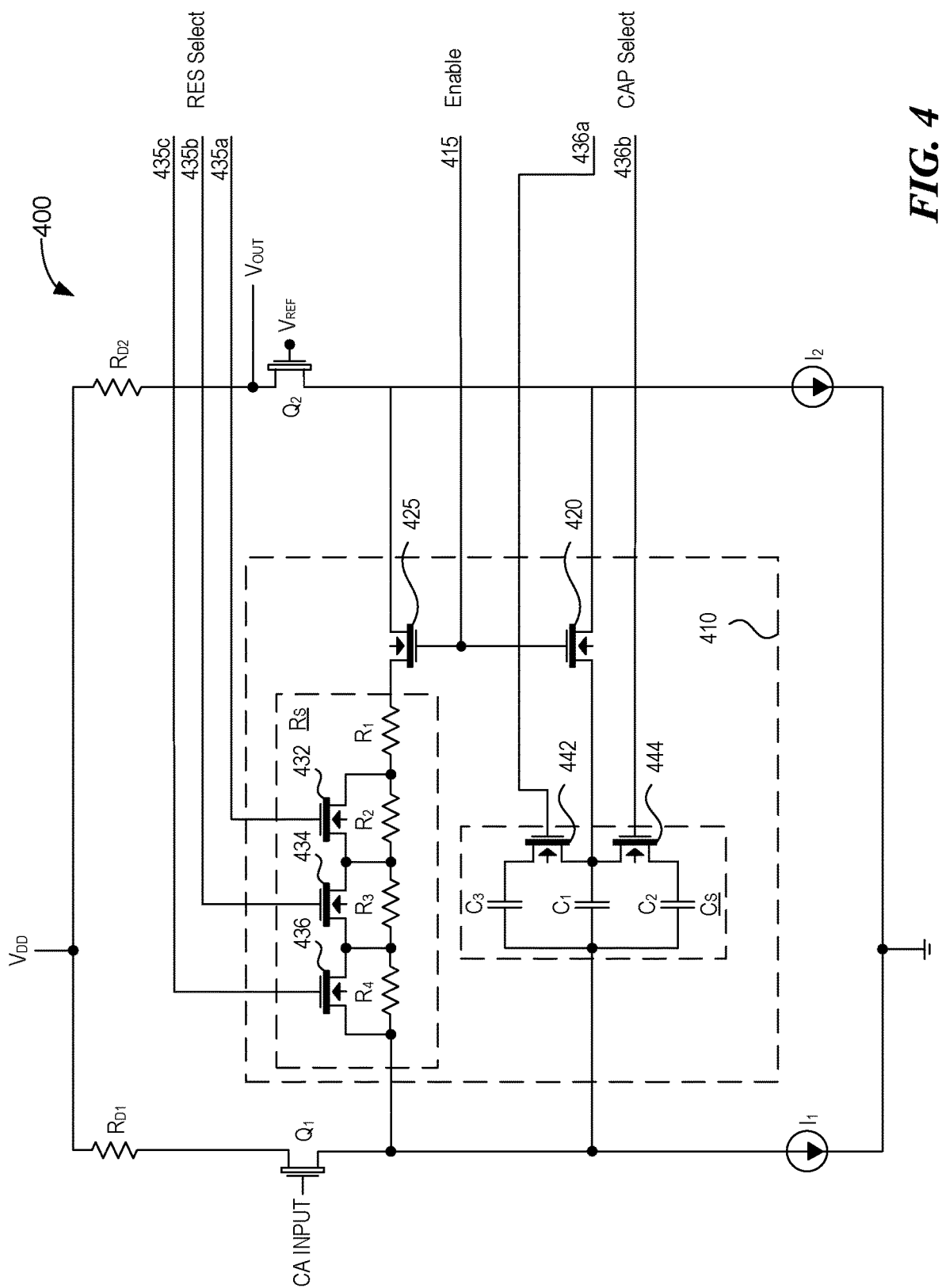
FIG. 4 is a simplified schematic of a continuous time linear equalizer in accordance with an embodiment of the present technology.

As discussed above, the signal integrity of CA signals CA0 to CA13 at CA inputs 310 can be reduced due to the high-frequency attenuation on the CA bus 204. To improve signal integrity, exemplary embodiments of the present technology can include an input buffer that can perform equalization on the input CA signals such as, for example, continuous time linear equalization. For example, FIG. 4 illustrates a filter circuit 400 that can perform CTLE to improve the signal integrity of the CA signals CA0-CA13 by boosting energy for the frequency that is being attenuated by the respective channel of the CA bus 204. That is, the filter circuit 400 can improve the data eye of the CA signals on the CA bus 204. In some embodiments, the filter circuit 400 can be included in the respective input buffer CA-IB0-CA-IB13.

As seen in FIG. 4, the filter circuit 400 includes transistors $Q_1$ and $Q_2$ and respective current sources $I_1$ and $I_2$, which are connected to form an amplifier circuit. The drains of the transistors $Q_1$ and $Q_2$ are connected in series to one end of resistors $R_{D1}$ and $R_{D2}$, respectively. The other ends of resistors $R_{D1}$ and $R_{D2}$ are connected to an appropriate source voltage (e.g., VDD). The current sources $I_1$ and $I_2$ are connected in series to the respective sources of transistors $Q_1$ and $Q_2$. The gate of transistor $Q_1$ can receive the appropriate CA input signal (e.g., CA0-CA13), and the gate of transistor $Q_2$ can receive an appropriate reference voltage signal $V_{REF}$ (e.g., VDD/2). The filter circuit 400 can also include a signal adjustment circuit 410 that can perform signal equalization by setting the frequency characteristics of the filter circuit 400 when enabled. When the signal adjustment circuit 410 is disabled, the respective CA input buffer CA-IB0 to CA-IB13 behaves as a conventional input amplifier buffer circuit with no signal equalization.

In some embodiments, the signal adjustment circuit 410 can perform CTLE on the CA input signal. The signal adjustment circuit 410 can include a variable impedance circuit to adjust the zero and pole frequency characteristics of the filter circuit 400. For example, the signal adjustment circuit 410 can include a resistor circuit Rs and/or a capacitor circuit Cs. In some embodiments the resistor circuit Rs can have a fixed resistance. In other embodiments, for example as seen in FIG. 4, the resistance value of resistor circuit Rs can be variable. Similarly, in some embodiments the capacitor circuit Cs circuit can have a fixed capacitance, and in other embodiments, for example as seen in FIG. 4, the capacitance value of capacitor circuit Cs can be variable. The resistor circuit Rs and/or the capacitor circuit Cs can set the frequency characteristics of the filter circuit 400 to a desired value. In embodiments where the resistor circuit Rs and/or the capacitor circuit Cs are variable, the frequency characteristics can be modified by varying the resistance of resistor circuit Rs and/or the capacitance of capacitor circuit Cs. Preferably, when the resistor circuit Rs and/or the capacitor circuit Cs are variable, the appropriate mode register settings can be programmed to adjust the resistance of the resistor circuit Rs and/or the capacitance of the capacitor circuit Cs. In some embodiments, the resistor circuit Rs and the variable capacitor circuit Cs can be connected in parallel.

The signal adjustment circuit 410 can be enabled by equalization signal 415. In some embodiments, the equalization signal 415 can be based on a status of a termination pin. For example, in some embodiments, similar to the CA-ODT pin for enabling ODT, the memory device 100 can include a CA-SIGEQ pin (not shown) for enabling signal equalization (e.g., CTLE) in the input buffer 107. When a dedicated CA-SIGEQ pin is used, the CA-SIGEQ pin can be disposed on the input buffer 107 along with the CA inputs 310 and/or the CA-ODT pin 210. Depending on how the filter circuit 400 is configured, a high status (e.g., VDD) or a low status (e.g., VSS) on the CA-SIGEQ pin can enable signal equalization.

In some embodiments, the CA signal equalization can be independent of the CA ODT. That is, memory devices 100 can independently enable the internal termination resistor RTT and the filter circuit 400 (e.g., in embodiments where a dedicated CA-SIGEQ pin is used). However, in other embodiments, the CA signal equalization can be based on the status of the CA-ODT pin 210 of a memory device 100. In such embodiments, a separate CA-SIGEQ pin may not be needed. For example, the memory device 100 can be configured such that, if the memory device 100 enables its internal termination resistor RTT, the CA signal equalization can also be enabled. In some embodiments, during startup of the memory device 100, the processor 103 of control logic circuit 102 (and/or another controller) can enable signal equalization based on the status of the CA-ODT pin 210 (e.g., tied to a voltage source). For example, if the memory device is CA-ODT enabled, the control logic circuit 102 can automatically set the equalization signal 415 to enable the signal adjustment circuit 410. When the equalization signal 415 is set, the CA input signal (e.g., CA1-CA13) is equalized and the equalized Vout signal is output to the appropriate address decode circuit 110 or the command decode circuit 115. In some embodiments, the signal equalization can include enhancing the high-frequency CA signals to counteract the attenuation due to the CA bus 204.

As seen in FIG. 4, the equalization signal 415 can turn ON transistors 420 and 425 to respectively connect resistor circuit Rs and capacitor circuit Cs between the sources of transistors Q1 and Q2. As discussed above, in some embodiments the resistor circuit Rs and/or the capacitor circuit Cs can be variable. In some embodiments, the resistor circuit Rs can include a plurality of resistors that can be separately enabled to vary the resistance of the resistor circuit Rs. For example, the resistor circuit Rs can include a resistors R1, R2, R3, and R4 connected in series. Of course, in other embodiments, the number of resistors can be greater than four or less than four. The resistor circuit Rs can include one or more transistors to selectively place the resistors in the current path. For example, each of the resistors R2, R3, and R4 can respectively be connected in parallel to transistors 432, 434, and 436 such that the transistors short the respective resistor when ON and the current path bypasses the shorted resistor. When all transistors 432, 434, and 436 are ON, only resistor R1 is in the current path and the resistance value of the Rs circuit equals R1. When the transistor 432, 434, and/or 436 is turned OFF, the respective resistor is placed in the current path. When all transistors 432, 434, and 436 are OFF, resistors R1, R2, R3, and R4 are in the current path and the resistance value of the Rs circuit equals R1+R2+R3+R4. In some embodiments, the resistors R1-R4 can all have the same value. In some embodiments one or more of the resistors R1-R4 can be different. In some embodiments, the values of resistors R1-R4 are set such that control of the transistors 432, 434, and 436 can provide step-wise adjustments for the value of Rs, which in some embodiments can be equal step-wise adjustments. The resistance value of resistor circuit Rs can depend on the desired characteristics of filter circuit 400 such as, for example, the gain characteristic of the filter circuit 400 and/or frequency characteristic (e.g., zero frequency and/or another frequency characteristic) of the filter circuit 400.

The transistors 432, 434, and 436, which adjust the resistance of resistor circuit Rs, can be controlled by resistance select signals 435a-c, respectively. The resistance select signals 435a-c can be driven based on setting in the mode register 104. For example, based on a calibration protocol (e.g., manufacturer's calibration, in-service calibration, and/or another calibration protocol), the fields in the mode register 104 can be set to appropriate values and the transistors 432, 434, and 436 can be selectively turned ON/OFF based on these mode register settings to provide the desired resistance value for resistor circuit Rs. In some embodiments, the mode register settings for controlling the transistors 432, 434, and 436 and thus the adjustment of the resistance value of resistor circuit Rs can be based on the mode register settings for the CA-ODT resistor RTT. That is, the resistance value of resistor circuit Rs can depend on the value of the internal termination resistor RTT. In such embodiments, the resistance value of the resistor circuit Rs can vary based on the value of RTT. For example, resistance value of resistor circuit Rs for memory devices with a 40-ohm internal termination resistance can be different than the resistance value of resistor circuit Rs for memory devices with an 80-ohm internal termination resistance. By adjusting the resistance value of resistor circuit Rs based on the value of RTT, CA signal integrity can be further optimized. In other embodiments, the mode register settings for controlling the transistors 432, 434, and 436 can be independent of the CA-ODT mode register setting.

In some embodiments, the capacitor circuit Cs can include a plurality of capacitors that can be separately enabled to vary the capacitance of the capacitor circuit Cs. For example, the capacitor circuit Cs can include a capacitors C1, C2, and C3 connected in parallel. Of course, in other embodiments, the number of capacitors can be greater than three or less than three. The capacitor circuit Cs can include one or more transistors to selectively place the capacitors in the current path. For example, each of the capacitors C2 and C3 can respectively be connected in series to transistors 442 and 444 such that the transistors place the respective capacitor in the current path when ON. When transistors 442 and 444 are ON, capacitors C1, C2, and C3 are in the current path and capacitance value of capacitor circuit Cs equals C1+C2+C3. When the transistor 442 and/or 444 is turned OFF, the current path for the respective capacitor is open. When transistors 442 and 444 are OFF, only capacitor C1 is in the current path and the capacitance value of capacitor circuit Cs equals C1. The capacitors C1-C3 can all have the same value or one or more can be different. In some embodiments, the values of capacitors C1-3 are set such that control of the transistors 442 and 444 can provide step-wise adjustments for the value of Cs, which in some embodiments can be equal step-wise adjustments. The value of capacitor circuit Cs can depend on the desired characteristics of filter circuit 400 such as, for example, the gain characteristic of the filter circuit 400 and/or frequency characteristic (e.g., zero frequency and/or another frequency characteristic) of the filter circuit 400.

The transistors 442 and 444, which adjust the capacitance of capacitor circuit Cs, can be controlled by capacitance select signals 436a,b, respectively. Similar to the resistance settings, the capacitance select signals 436a,b can be driven based on setting in the mode register 104. For example, based on a calibration protocol (e.g., manufacturer's calibration, in-service calibration, and/or another calibration protocol), fields in the mode register 104 can be set to appropriate values and the transistors 442 and 444 can be selectively turned ON/OFF based on the mode register settings to provide the desired capacitance value for capacitor circuit Cs. In some embodiments, the mode register settings for controlling the transistors 442 and 444 and thus the adjustment of the capacitance value of capacitor circuit Cs can be based on the mode register settings for the CA-ODT resistor RTT. That is, the capacitance value of capacitor circuit Cs can depend on the value of the internal termination resistor RTT. In such embodiments, the capacitance value of the capacitor circuit Cs can vary based on the value of RTT. For example, capacitance value of capacitor circuit Cs for memory devices with a 40-ohm internal termination resistance can be different than the capacitance value of capacitor circuit Cs for memory devices with an 80-ohm internal termination resistance. By adjusting the capacitance value of capacitor circuit Cs based on the value of RTT, CA signal integrity can be further optimized. In other embodiments, the mode register settings for controlling the transistors 442 and 444 can be independent of the CA-ODT mode register setting. Of course, the above embodiments for a variable resistor circuit Rs and a variable capacitor circuit Cs are exemplary and other signal equalization and/or CTLE circuit configurations can be used.

Figure 5:
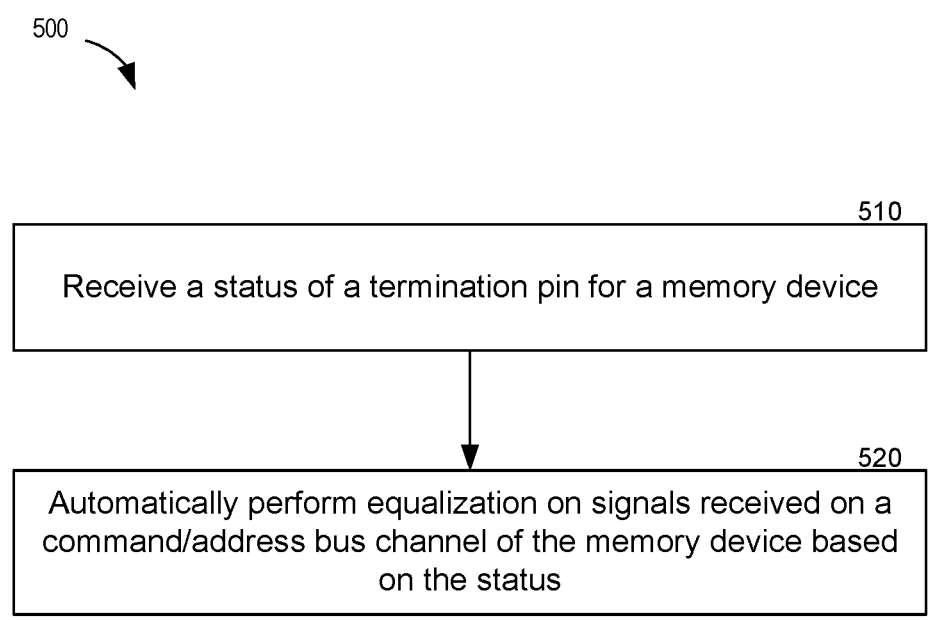
FIG. 5 is a flow chart illustrating a method of performing command/address signal equalization in accordance with an embodiment of the present technology.

FIG. 5 is a flow diagram illustrating example method 500 for managing CA command signal equalization in memory devices. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the processor 103 and/or another processor or controller. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 510, the processing device (e.g., processor 103 and/or another processor or controller) receives a status of a termination pin for a memory device. For example, as discussed above, the status of the CA-ODT pin can determine whether to enable signal equalization in filter circuit 400.

At block 520, the processing device (e.g., processor 103 and/or another processor or controller) automatically performs equalization on signals received on a command/address bus channel based on the status. For example, as discussed above, filter circuit 400 performs equalization on the CA input signals for CA-ODT enabled memory devices 100. In some embodiments, the equalization can be continuous time linear equalization.

Although in the foregoing example embodiments, memory modules and devices have been illustrated and described with respect to DRAM devices, embodiments of the present technology may have application to other memory technologies, including SRAM, SDRAM, NAND and/or NOR flash, phase change memory (PCM), magnetic RAM (MRAM), ferroelectric RAM (FeRAM), etc. Moreover, although memory modules have been illustrated and described as dual in-line memory modules (DIMMs) having 20 memory devices, embodiments of the disclosure may include more or fewer memory devices, and/or involve other memory module or package formats (e.g., single in-line memory modules (SIMMs), small outline DIMMS (SODIMMs), single in-line pin packages (SIPPs), custom memory packages, etc.).

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method comprising:
receiving a status of whether on-die-termination of command/address signals is enabled or disabled for a memory device; and
performing equalization on the command/address signals, including enhancing attenuated command/address signals, received on a command/address bus channel of the memory device when the status indicates that on-die-termination of the command/address signals is enabled and not performing equalization on the command/address signals when the status indicates that on-die-termination of command/address signals is disabled.

2. A method comprising:
receiving a status of a termination pin for a memory device; and
performing equalization on signals received on a command/address bus channel of the memory device based on the status,
wherein the equalization includes performing a continuous time linear equalization.

3. The method of claim 2, wherein the termination pin is an on-die-termination pin used for enabling an internal termination resistor, and
wherein the equalization on the signals is performed when the internal termination resistor is enabled and the equalization on the signals is not performed when the internal termination resistor is not enabled.

4. The method of claim 2, wherein the performing continuous time linear equalization is done by a filter circuit in an input buffer circuit.

5. The method of claim 4, wherein the automatically performing equalization includes setting a characteristic of the filter circuit, and
wherein the characteristic is at least one of a gain characteristic or a frequency characteristic of the filter circuit.

6. The method of claim 5, wherein the setting of the characteristic includes changing a value of at least one of a resistance or a capacitance of the filter circuit.

7. The method of claim 5, wherein the frequency characteristic is at least one of a zero frequency or pole frequency of the filter circuit.

8. The method of claim 5, wherein the setting of the characteristic is based on settings in a mode register of the memory device.

9. The method of claim 5, wherein the characteristic is based on a value of an internal termination resistance used for on-die-termination of the command/address bus channel.

10. The method of claim 9, further comprising:
setting the internal termination resistor based on settings in a mode register of the memory device; and
adjusting at least one of a resistance or a capacitance of the filter circuit based on the mode register settings.

11. An apparatus, comprising:
an input buffer circuit configured to receive signals from a command/address bus channel;
a termination pin to enable or disable on-die-termination of command/address signals based on a voltage state of the termination pin; and
a filter circuit configured to automatically perform equalization on the command/address signals, including enhancing attenuated command/address signals, when the on-die-termination of the command/address signals is enabled and not performing equalization on the command/address signals when the on-die-termination of the command/address signals is disabled.

12. An apparatus, comprising:
an input buffer circuit configured to receive signals from a command/address bus channel,
a termination pin; and
a filter circuit configured to automatically perform equalization on the signals based on a status of the termination pin,
wherein the equalization includes performing a continuous time linear equalization.

13. The apparatus of claim 12, wherein the termination pin is an on-die-termination pin used for enabling an internal termination resistor, and
wherein the filter circuit is configured to perform equalization on the signals when the internal termination resistor is enabled, and the filter circuit is configured to not perform the equalization on the signals when the internal termination resistor is not enabled.

14. The apparatus of claim 13, wherein the filter circuit is disposed in the input buffer circuit.

15. The apparatus of claim 11, wherein the automatically performing equalization includes setting a characteristic of the filter circuit, and
wherein the characteristic is at least one of a gain characteristic or a frequency characteristic of the filter circuit.

16. The apparatus of claim 15, wherein the setting of the characteristic includes changing a value of at least one of a resistance or a capacitance of the filter circuit.

17. The apparatus of claim 15, wherein the frequency characteristic is at least one of a zero frequency or pole frequency of the filter circuit.

18. The apparatus of claim 15, wherein the setting of the characteristic is based on settings in a mode register of the memory device.

19. The apparatus of claim 15, wherein the characteristic is based on a value of an internal termination resistance used for on-die-termination of the command/address bus channel.

20. The apparatus of claim 19, wherein the filter circuit is configured to adjust at least one of a resistance or a capacitance of the filter circuit based on the mode register settings for the internal termination resistor.

* * * * *